United States Patent
Marangoni et al.

(10) Patent No.: US 11,942,896 B2
(45) Date of Patent: Mar. 26, 2024

(54) PROTECTION DEVICE FOR A DIRECT CURRENT ELECTRICAL PLANT

(71) Applicants: SOCIETA' ELETTRICA S.R.L., Fusignano (IT); Euro Marangoni, Lugo (IT)

(72) Inventors: Euro Marangoni, Lugo (IT); Armando Randi, Bagnacavallo (IT); Carlo Bambi, Pieve di Cento (IT)

(73) Assignee: SOCIETA' ELETTRICA S.R.L., Fusignano (IT)

( * ) Notice: Subject to any disclaimer, the term of this patent is extended or adjusted under 35 U.S.C. 154(b) by 459 days.

(21) Appl. No.: 17/283,857

(22) PCT Filed: Oct. 10, 2019

(86) PCT No.: PCT/IB2019/058677
§ 371 (c)(1),
(2) Date: Apr. 8, 2021

(87) PCT Pub. No.: WO2020/075123
PCT Pub. Date: Apr. 16, 2020

(65) Prior Publication Data
US 2021/0351744 A1 Nov. 11, 2021

(30) Foreign Application Priority Data

Oct. 11, 2018 (IT) .......................... 102018000009387

(51) Int. Cl.
*H02S 50/10* (2014.01)
*H02H 1/00* (2006.01)
(Continued)

(52) U.S. Cl.
CPC ........... *H02S 50/10* (2014.12); *H02H 1/0015* (2013.01); *H02H 3/087* (2013.01); *H02H 7/1222* (2013.01)

(58) Field of Classification Search
CPC ...... H02S 50/10; H02H 1/0015; H02H 3/087; H02H 7/1222; H02H 1/04; G01R 19/0007;
(Continued)

(56) References Cited

U.S. PATENT DOCUMENTS

2008/0204949 A1* 8/2008 Zhou .................... H02H 1/0015
361/42
2010/0085206 A1* 4/2010 Nayak ...................... H02H 3/04
340/815.45
(Continued)

FOREIGN PATENT DOCUMENTS

| EP | 3327885 A2 | 5/2018 |
| JP | 2018121434 A | 8/2018 |
| WO | 2016001824 A1 | 1/2016 |

OTHER PUBLICATIONS

Yao Xiu, et al., "Impact Evaluation of Series DC Arc Faults in DC Microgrids", 2015 IEEE Applied Power Electronics Conference and Exposition (APEC), IEEE, Mar. 15, 2015, pp. 2953-2958, XP032775066.

*Primary Examiner* — Giovanni Astacio-Oquendo
(74) *Attorney, Agent, or Firm* — Pearne & Gordon LLP; Bryan M. Gallo

(57) ABSTRACT

A device (9) for protecting a direct current electrical system (1) having one or more modules (2) from electric arcs comprises: a first sensor (10) provided with a first ring of ferromagnetic material configured to generate a first signal, representing a oscillating component of a current flowing through a cable inserted into the ring; a conditioning stage (12), having a bandpass filter, for conditioning the first signal; a first threshold comparator (13); a counter (15); a processor (14); a second sensor (19), configured to generate
(Continued)

a second signal representing a direct current component of the current flowing through the cable; a second threshold comparator (20).

17 Claims, 5 Drawing Sheets

(51) Int. Cl.
*H02H 3/087* (2006.01)
*H02H 7/122* (2006.01)

(58) Field of Classification Search
CPC ........ G01R 19/16528; G01R 19/16538; G01R 23/165; G01R 31/12; Y02E 10/50; H01F 38/30
USPC .................................... 324/761.01, 537, 500
See application file for complete search history.

(56) References Cited

U.S. PATENT DOCUMENTS

| | | | |
|---|---|---|---|
| 2011/0141644 A1 | 6/2011 | Gisske | |
| 2012/0112760 A1* | 5/2012 | Yoscovich | H02H 7/20 324/536 |
| 2013/0124122 A1* | 5/2013 | Cook | H02S 50/10 702/64 |
| 2014/0347069 A1* | 11/2014 | Krumpholz | H02H 3/52 324/541 |
| 2014/0373894 A1* | 12/2014 | Stratakos | H02H 1/0015 136/244 |
| 2016/0187408 A1* | 6/2016 | Kolker | G01R 19/16533 324/551 |
| 2018/0145497 A1 | 5/2018 | Jakupi | |
| 2019/0288643 A1* | 9/2019 | Ikemoto | H02H 1/0015 |
| 2021/0281061 A1* | 9/2021 | Song | H01M 10/48 |

* cited by examiner

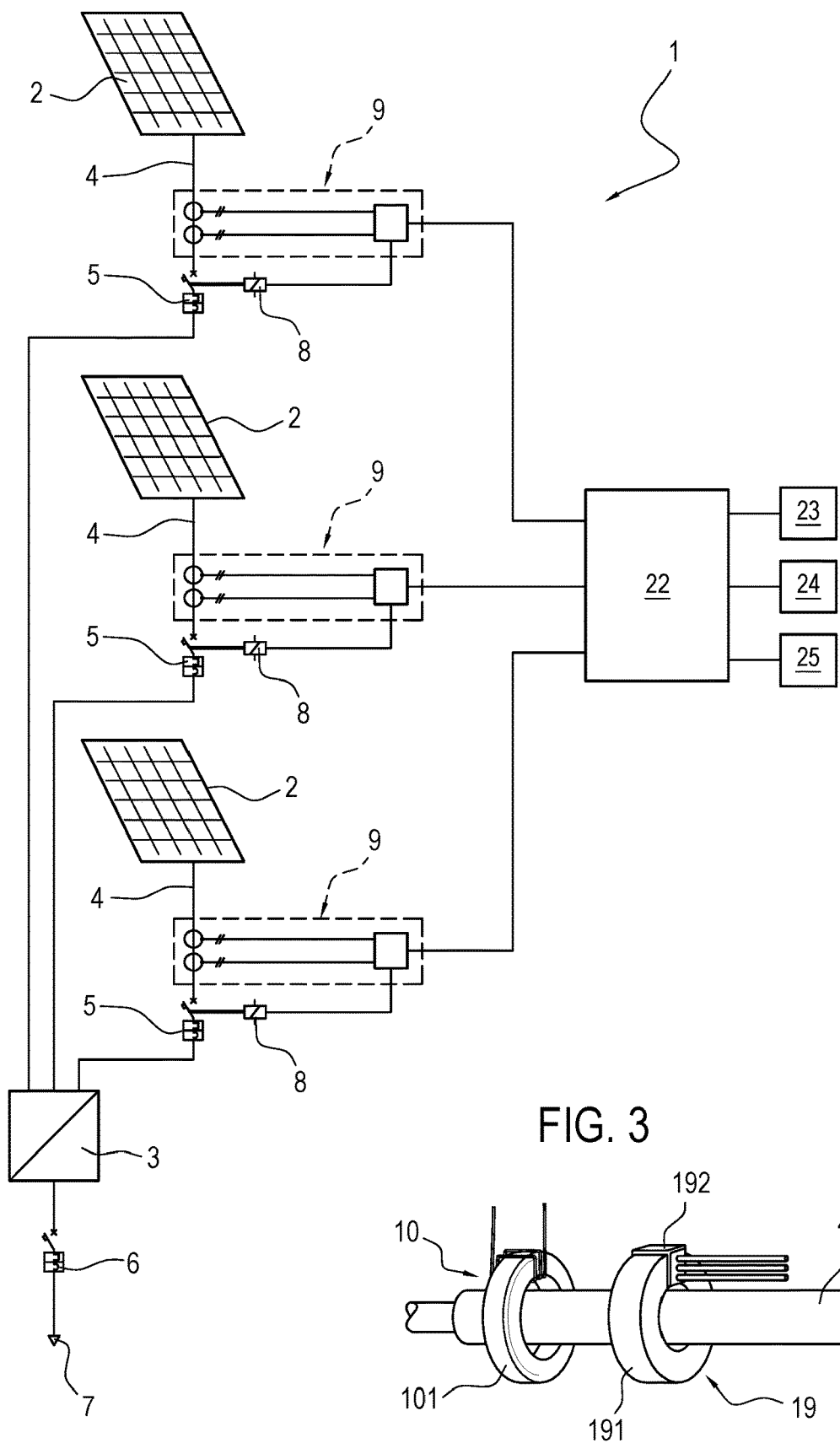

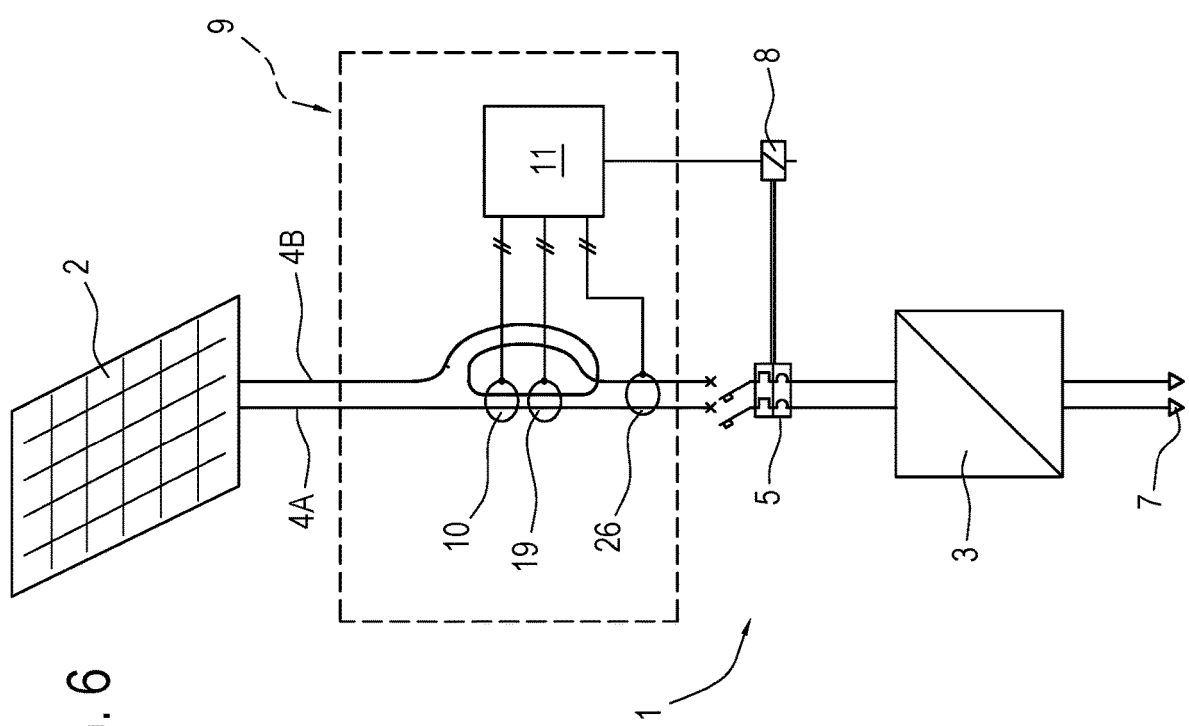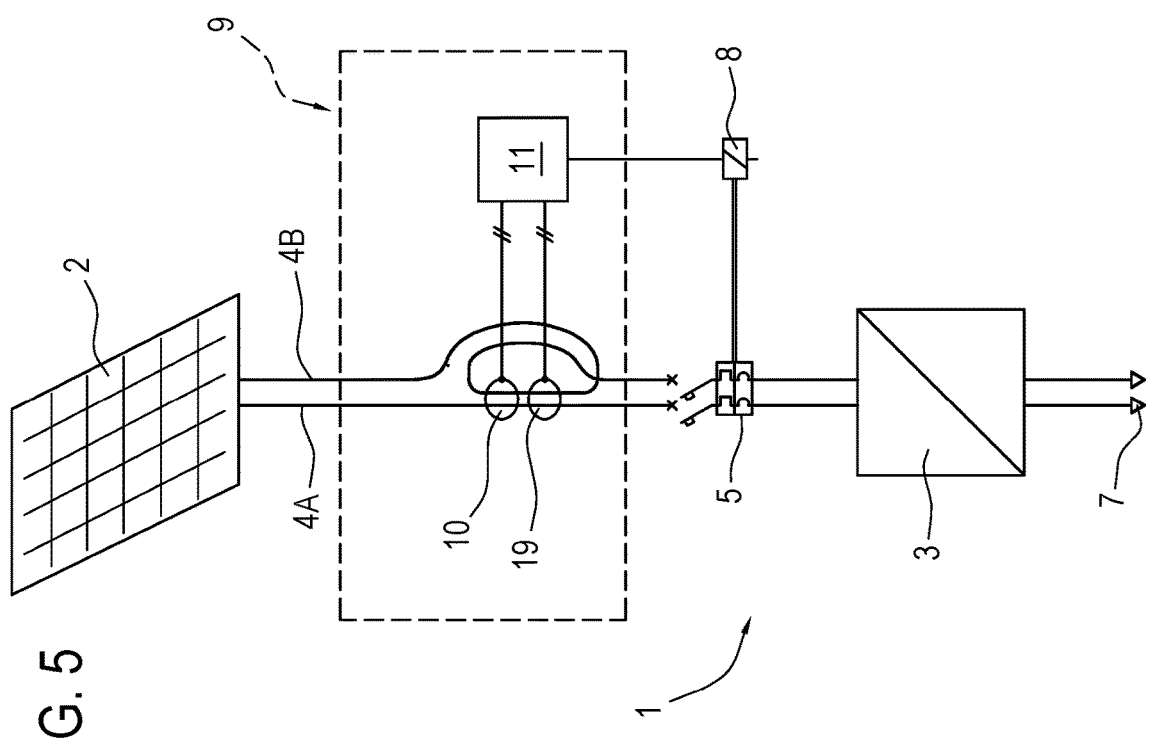

PROTECTION DEVICE FOR A DIRECT CURRENT ELECTRICAL PLANT

TECHNICAL FIELD

This invention relates to a device and a method for protecting electrical systems from electric arcs.

Preferably, this invention relates to a device and a method for protecting direct current electrical systems from electric arcs.

BACKGROUND ART

In particular, direct current electrical systems mean: photovoltaic systems having one or more photovoltaic modules which are connected to an inverter; storage systems comprising one or more batteries; and in general all systems configured to supply a direct current. It should be noticed that photovoltaic module means a matrix (or an array) of photovoltaic panels which are configured to generate an electric current in response to solar radiation received by the panel itself. The electric current supplied by the photovoltaic modules is a direct current, therefore the photovoltaic modules are connected to an inverter, that is to say, to a power voltage converter, which converts the direct current received as input into an alternating voltage made available as output, for powering user devices or for feeding electric power into the mains network.

As is known, photovoltaic systems are not free from faults and consequent possible fires; the faults may relate to the photovoltaic modules themselves or other parts of the system. In light of this, the current practice is to equip photovoltaic systems with switches intended to interrupt the current in the system, or in a part of it, in the event of a fault, before a fire starts; the switches of that type are usually called AFCI (Arc Fault Circuit Interrupter). Those switches are operated by fault detector devices, that is to say, protection devices intended to detect the presence of a fault in the system, for supplying as output a control signal for the protection switch.

Patent document WO2016/001824 makes available a device for protecting from electric arcs which is configured to generate a fault signal as a function of the amplitude of a signal generated by a sensor and conditioned by bandpass filter staying above a reference value, for a predetermined time interval.

In general, a major problem linked to prior art protection devices is that of false faults, that is to say, protection device interventions caused not by a fault, but by a disturbance generated outside the system or, more often, by the system inverter. Indeed, prior art devices are of limited reliability as regards distinguishing electric arcs from false faults, which leads to unwanted interventions by the protection device.

One requirement linked to such devices is that of facilitating operations for resetting the system following opening of the switch and of verifying the cause of that opening (if the opening has been caused by an electric arc or instead by a false fault), allowing such operations to be performed even by less expert operators.

Moreover, there is the requirement to keep track of false faults (checked by an operator) which may have occurred due to a disturbance present in a system at a predetermined frequency, and to update the system to automatically distinguish that disturbance from an electric arc.

In general, there are also problems linked to the identification of anomalous conditions or faults of a part of the device or of the system.

DISCLOSURE OF THE INVENTION

The aim of this invention is to make available a device and a method for protecting direct current electrical systems from electric arcs, which overcome the above-mentioned disadvantages of the prior art.

Said aim is fulfilled by the device and by the method according to this invention, which are characterized as described in the claims below.

In one example, the electrical system is a photovoltaic system (which itself may be protected by part of this patent document), comprising one or more photovoltaic modules. Each photovoltaic module includes a plurality of photovoltaic panels, preferably connected in series. The system preferably comprises an inverter connected downstream of the photovoltaic modules. The system preferably comprises one or more protection switches inserted between the inverter and the photovoltaic modules.

According to the invention, at least one protection device is inserted in a branch which connects the photovoltaic modules to the inverter, in order to detect the presence of an electric arc in the system and generate a fault signal and transmit it to the protection switch in order to open the switch. Preferably, the system comprises a plurality of protection devices, one protection device for each group (array or string) of photovoltaic panels connected in series. Alternatively, the system comprises a protection device for each photovoltaic module. Alternatively, the system comprises a protection device for all of the photovoltaic modules, which is positioned downstream of them, but preferably always upstream of the inverter DC side (or of a storage battery charging regulator, if present).

In another example, the electrical system is an electric battery charging electrical system; in this case the modules are charging modules of the electric battery. That electrical system is a direct current electrical system.

In another example, the electrical system is an alternating current electrical system, such as a domestic electrical system of a home or the electrical system of a hospital or of a shopping centre or of a factory.

That protection device comprises a first sensor provided with a first ring (or toroid) made of ferromagnetic material and configured to generate a first signal, representing a current flowing through a cable inserted into the ring. In particular, the first sensor is configured to generate a voltage signal in the whole spectrum of frequencies of the current flowing through the cable.

The cable includes a positive conductor (or wire) and a negative conductor (o wire). Preferably, the positive conductor and the negative conductor are wrapped in a single sheath. Both the positive conductor and negative conductor are inserted into the ring.

The protection device comprises a box-shaped body containing a circuit board of the device.

In particular, the protection device (that is to say, its circuit board) comprises a conditioning stage having a bandpass filter, for conditioning the signal generated by the first sensor.

The protection device (that is to say, its circuit board) also comprises a (threshold) comparator, having a first, preset, adjustable voltage reference value (that is to say, settable to another value by the person who installs the device), configured to receive as input the conditioned signal.

The protection device (that is to say, its circuit board) comprises a processor, connected to the comparator in order to generate a fault signal as output from the device.

The expression "processor" means any electronic component or group of components suitable for receiving a signal as input and for performing processing to make available as output another signal, as a function of the signal received as input. For example, the processor may be made by means of an electronic circuit (analogue or digital), or by means of a suitably programmed CPU, or other technical solution intended to make a control logic.

In one embodiment, the protection device (that is to say, its circuit board) also comprises a counter, that is to say, a timer.

The protection device, in one embodiment, comprises a second sensor, configured to generate a second signal representing a direct current component of the current flowing through the cable.

It should be noticed that, within the scope of this invention, "direct current component" is defined as a direct current or substantially direct current (that is to say, low frequency alternating) component.

The protection device, in one embodiment, comprises a second threshold comparator, having a second preset, adjustable voltage reference value. The second comparator is configured to receive as input the second signal generated by the second sensor.

The processor is programmed to generate a fault signal in response to the occurrence of both of the following conditions, combined: the first signal (detected by the first sensor and conditioned by the conditioning stage) exceeds the first reference value of the first comparator, the second signal (detected by the second sensor) exceeds the second reference value of the second comparator.

Therefore, the processor is programmed to generate the fault signal as a function of the first signal generated and conditioned exceeding the first reference amplitude value and simultaneously (or substantially simultaneously, out of phase by thousandths or tenths of a second) the second signal exceeding the second reference amplitude value. Indeed, if the second signal, representing the direct current or low frequency component of the current flowing through the cable, does not exceed a minimum reference value, it is reasonable to assume that any high value of the first signal is not attributable to an electric arc which occurred in the system and to avoid a false fault signal.

Preferably, the processor is programmed to activate the counter upon occurrence of both the conditions of the first signal exceeding the first reference value of the first comparator and the second signal exceeding the second reference value of the second comparator. Preferably, the processor is programmed to generate a fault signal as a function of the amplitude of the first signal generated and conditioned staying above the first reference value and the amplitude of the second signal staying above the second reference value concurrently for at least a predetermined time interval. In other words, the processor is programmed to generate the fault signal when the amplitude of the signal generated and conditioned exceeds the reference value and stays above that reference value for the predetermined time interval after exceeding the value. That predetermined time interval is detected by the processor by means of the counter, that is to say, through an activation of a count (that is to say, of the counter itself) in response to the first signal generated exceeding the first reference value of the comparator and to the second signal generated exceeding the second reference value of the comparator.

If, after the first and second signal generated has respectively exceeded the first and second reference value, the amplitude of at least one of the first and second signal falls below the respective reference value before the predetermined time interval has elapsed, the counter is reset and configured to restart from the beginning the count of the predetermined time interval, starting from a subsequent case of the amplitude of the first signal generated and conditioned exceeding the first reference value, combined with the amplitude of the second signal exceeding the second reference value.

That allows the avoidance of false interventions and renders the device particularly reliable. Indeed, it should be noticed that the electric arc in the photovoltaic system is sustained by solar energy and, during regular running, generates a ripple in the current supplied by the photovoltaic module or groups of modules in which the arc occurred. Therefore, if the increase in voltage in the branch into which the protection device is inserted does not maintain a predetermined amplitude, in a predetermined frequency band, for a predetermined time, it is reasonable to assume that it is not attributable to an electric arc which occurred in the system.

Preferably, the second signal represents the component of the current flowing through the cable having a frequency between 0 Hz and 20 kHz.

In one embodiment, the second sensor includes a low-pass filter.

In one embodiment, the second sensor is configured to detect only the direct current (or substantially direct current) component of the current flowing through the cable. In one embodiment, the second sensor includes a second ring (or toroid) of ferromagnetic material surrounding the cable. In one embodiment, the second sensor includes a Hall effect probe. The Hall effect probe is configured to detect a difference in electromagnetic potential between a pair of ends of a section of the second ring of ferromagnetic material; indeed, the difference in potential represents a magnetic field generated by the direct current component of the current flowing through the cable. In one embodiment, the Hall effect probe is applied to the second ring.

In one embodiment, the first ring and the second ring are embedded in a dielectric matrix (for example, a resin finish).

In another embodiment, the device comprises a single ring (defining the first sensor) and the Hall effect probe (defining the second sensor) is applied to the ring.

Therefore, according to one aspect of this invention, the bandpass filter of the conditioning stage has a pass band placed in an interval of frequencies which are higher than the frequency of the component detected by the second sensor.

Preferably, the bandpass filter of the conditioning stage has a pass band placed in an interval (or range) of frequencies between 20 kHz and 2.5 MHz. In one embodiment, the pass band is selectable in the frequency interval by means of a selector. In one embodiment, the pass band is fixed within the interval.

Even more preferably, the bandpass filter of the conditioning stage has a pass band placed in an interval of frequencies between 1 MHz and 2.5 MHz. In particular, in one embodiment, the bandpass filter of the conditioning stage has the band centre positioned (or set by selection) to (or approximately to) 2 MHz.

In one embodiment, the pass band has a width of lower than 250 kHz.

In one embodiment, the pass band has a width of between (or approximately) between 10 and 20% of the band centre value set.

It should be noticed that the highest frequencies are cut to eliminate a pulse associated with an arc triggering transient, as well as to eliminate various disturbances and noises which may be present in the system.

It should be noticed that the presence of the ferromagnetic ring or rings (which constitute a signal current transformer and may also be openable and re-closable), facilitates installation of the device, because it avoids having to cut or detach the system cable in which the device is to be inserted or in any case opening the circuit.

Preferably, after the first reference value of the first comparator has been exceeded combined with the second reference value of the second comparator being exceeded, the processor is programmed to derive a variation in the unit of time of the amplitude of the current detected by the first sensor. That makes the device more robust and improves the selectivity of the safety device in detecting the fault, in the case in which there are various protection devices, each inserted downstream of a corresponding group of photovoltaic modules.

In one embodiment, the conditioning stage has two or more bandpass filters, defining bands which occupy different, consecutive portions of a predetermined frequency interval. The two or more bandpass filters are operatively connected in parallel. In one embodiment, the device further comprises a selector connected to the conditioning stage and configured to set a bandpass filter alternative to the other bandpass filter or filters. Therefore, operatively, the bandpass filters are settable alternatively to each other by means of the selector.

In this way, during installation, it is possible to select a pass band in which the background noise is notably below the first reference value (so that the first signal exceeding the first reference value is recognisable as an indicator of a fault). The selector may be for example a lever or a push-button or a switch which can be operated electronically.

In one embodiment, the device comprises a memory (or a database), connected to the processor. In another embodiment, the processor is connected to a memory (or database) external to the device (for example, placed on a remote server).

In one embodiment, the device comprises a user interface connected to the processor. The user interface is programmed to receive an adjustment command from a user. In one embodiment, the user interface is programmed to receive a false positive command (or indication) from a user. The user interface may be, for example, a keyboard.

In one embodiment, the selector is configured to set the two or more bandpass filters of the conditioning stage in succession in response to the adjustment command. In other words, when a user gives an adjustment command, the selector sweeps the frequency interval defined by the conditioning stage, activating in succession the frequency bands of the various selectors.

At this point, the operator checks if the activation of a band causes a false positive and, if it does, gives a false positive command.

In one embodiment, the processor is configured to save in the memory, in response to the false positive command, the bandpass filter for which the false positive occurred. In particular, the false positive may be saved in terms of amplitude, spectral distribution and duration of the signals for which the false positive occurred.

The operator also gives the false positive command (which may be saved by the memory) when, on a system already installed, a false fault occurs. Therefore, the device self-learns if a predetermined bandpass filter has caused a false positive, and positions itself on another band or gives a signal to the operator, who will select another band.

In particular, for each fault signal generated by the processor, the processor saves in the database a record including one or more of the following pieces of information: voltage value of the output signal from the conditioning stage upon occurrence of the fault signal; a piece of information relative to the bandpass filter selected when the fault signal occurred (in particular, lower and upper limits of the frequency interval defined by the filter); false positive or real fault indication supplied by the user; time indication relative to the moment in which the fault signal occurred (for example, date and time); radiation to earth value at the moment in which the fault signal occurred (which may be detected by sensors external to the device and connected to the processor); value of power supplied by the electrical system at the moment in which the fault signal occurred (which may be detected by sensors external to the device and connected to the processor).

It should be noticed that the database created in this way may itself be the subject matter of this invention; the database includes, for a plurality of fault signals generated by one or more protection devices, a respective record including one or more of the pieces of information listed above.

In one embodiment, the device is configured to generate, as output, a binary signal which indicates to the user whether a fault (that is to say, an electric arc) has been detected: for example, the device may include an LED which is activated when the fault signal is generated and remains active until the system has been reset (the protection switch is re-armed).

Moreover, the device may include a screen, connected to the processor. The screen may be configured to receive from the processor and to display in real time a voltage value representing an amplitude of the first signal conditioned by the conditioning stage.

In one embodiment, the device includes a spectrum analyser (including an oscilloscope), configured to detect the voltage value of the first signal generated by the first sensor, upstream of the conditioning stage, in a spectrum of frequencies of the first signal. The screen may be configured to display in real time the voltage value of the first signal generated by the first sensor, upstream of the conditioning stage, in the spectrum of frequencies of the first signal; in other words, the screen may be configured to display in real time a voltage-frequency graph of the first signal generated by the first sensor.

The screen may be configured to display in real time the voltage value of the second signal generated by the second sensor.

In one embodiment, the device comprises a self-diagnosis module. The self-diagnosis module is connected (or integrated) to the processor. The self-diagnosis module is configured to generate a test signal and to verify a response signal. The test signal is, for example, a direct current voltage signal and/or a white noise.

Preferably, the self-diagnosis module is configured to generate an alert signal as a function of the response signal. The alert signal represents an anomalous state of the device, for example a cable or a sensor not intact.

In one embodiment, the test signal is generated as input for the first sensor. In one embodiment, the test signal is generated as input for the second sensor.

In one embodiment, the test signal is generated as input for the circuit board (or part of it). In one embodiment, the test signal is generated as input for the conditioning stage.

Preferably, the self-diagnosis module is connected to the counter (or to a further counter) for repeating a predetermined self-diagnosis procedure at predetermined time intervals, cyclically.

It should be noticed that, in one or more embodiments, the protection device could not be provided with the second sensor. In particular, there is at least one embodiment in which the device comprises a first sensor (provided with a ring of ferromagnetic material configured to generate a signal, representing a current flowing through a cable inserted into the ring), a threshold comparator (having a preset, adjustable voltage reference value, the comparator being configured to receive as input the signal conditioned by the conditioning stage) and a processor programmed to generate a fault signal in response to the signal generated by the sensor exceeding the reference value of the comparator (for at least a predetermined time interval).

Moreover, in the one or more embodiments of this invention, the bandpass filter of the conditioning stage has a pass band placed (or positioned by selection) in a frequency interval between 1 and 2.5 MHz. Preferably, the bandpass filter has the band centre placed at around 2 MHz.

In particular, according to one or more embodiments, a protection device is made (which could also include a single sensor) in which the bandpass filter has a pass band placed (that is to say, placeable by means of selector) in a frequency interval between 1 and 2.5 MHz. Indeed, it was observed that said solution gives good precision in the identification of the fault, since often the frequency generated by the fault itself is in a frequency band between 1 MHz and 2.5 MHz.

The invention according to this description also makes available an inverter (that is to say, a DC/AC power converter) which incorporates (or includes, or comprises) a device for protecting from electric arcs according to one or more of the aspects illustrated in this description.

In particular, in one or more embodiments, the inverter comprises a protection device including a filter operating in a frequency band selectable (that is to say, with selectable band centre) between 1 MHz and 2.5 MHz. Preferably, the filter has a band width approximately having a value between 10% and 20% of the band centre value set.

The invention according to this description also makes available an electrical system. Preferably, the electrical systems is a direct current electrical system, for example: photovoltaic systems having one or more photovoltaic panels which are connected to an inverter; storage systems comprising one or more batteries.

The system comprises one or more modules (for example, photovoltaic modules or storage modules).

In one embodiment, the system comprises an inverter connected downstream of the one or more modules.

The system comprises one or more protection switches inserted between the inverter and the modules.

The system comprises a protection device, inserted in a branch which connects the one or more modules to the inverter. The protection device is configured to detect the presence of an electric arc in the system and generate a fault signal and transmit it to the protection switch in order to open the switch.

In one embodiment, the protection device is incorporated in the inverter. It should be noticed that, in this embodiment, the protection device is configured to switch off the inverter itself in response to detection of the fault signal (that is to say, of the electric arc).

In one embodiment, the electrical system comprises a plurality of groups of modules, each of which includes one or more modules.

In one embodiment, the electrical system comprises for each group of modules of the plurality of groups, a respective protection switch and a respective protection device configured to detect the presence of an electric arc in the group and to generate a fault signal and transmit it to the protection switch of the respective group in order to open the switch.

In one embodiment, the electrical system comprises a (central) processing unit. The processing unit is connected to the protection devices of the groups of the plurality of groups. The processing unit is configured to receive from each protection device the respective first signal and the respective second signal, to process the first signal and the second signal received from the protection devices and to derive a diagnostic indication regarding a condition of the system as a function of the first signal and the second signal received from the protection devices. For example, the processing unit may derive, by means of comparative analysis of the signals arriving from the groups of modules, indications regarding the ageing state or fault state of one or more modules, verifying if a module or group of modules does not have a normal production.

The invention according to this description also makes available a method for protecting an electrical system. The electrical system comprises one or more modules.

In one embodiment, the method comprises a step of providing a protection switch. In one embodiment, the method comprises a step of providing a protection device.

In one embodiment, the method comprises a step of installing the protection switch and the protection device in a connecting branch which connects the one or more modules. The protection device is programmed to generate a fault signal and transmit it to the protection switch in order to open the switch.

Preferably, the connecting branch connects the one or more modules to an inverter; therefore, opening of the switch isolates the modules from the inverter.

According to one aspect of this description, it also makes available a method for installing and calibrating (or adjusting) a protection device of a photovoltaic system.

In one embodiment, the step of installing (or the installing method) includes inserting a cable, defining the connecting branch which connects the one or more modules, into a first through hole of the protection device. The first through hole is preferably defined by a first ring of ferromagnetic material, forming a first sensor configured to generate a first signal, representing a current flowing through the cable.

In one embodiment, the step of installing includes adjusting the protection device. Adjusting the device includes setting a first reference value of a first threshold comparator, configured to receive the first signal downstream of a conditioning stage connected downstream of the first sensor. In one embodiment, adjusting the device includes setting a second reference value of a second threshold comparator configured to receive the second signal.

In one embodiment, the step of installing includes connecting a second sensor to the cable defining the connecting branch. The second sensor is configured to generate a second signal representing a direct current component of the current flowing through the cable.

In one embodiment, the fault signal fault signal is generated as a function of the occurrence of both of the following conditions, combined (in one embodiment, simultaneously): the first signal exceeds the first reference value of the first comparator, the second signal exceeds the second reference value of the second comparator.

In one embodiment, the fault signal is generated as a function of the amplitude of the first signal generated and conditioned staying above the first reference value and simultaneously the amplitude of the second signal staying above the second reference value concurrently for at least a predetermined time interval.

In one embodiment, adjusting the protection device involves setting a predetermined time interval.

After having coupled the first sensor and the second sensor downstream of the groups of modules, a test is carried out in which an arc is simulated, for then detecting the first signal provided as output by the conditioning stage; that allows an assessment of the amplitude of the signal in fault conditions, for a predetermined configuration of the filter of the conditioning stage.

As a function of that detection, the first reference value of the first comparator is adjusted so that the first signal detected exceeds that value.

Moreover, there is detection of the first signal provided as output by the conditioning stage in arc absence conditions, to detect the level of background noise and disturbances in the system, for a predetermined configuration of the filter of the conditioning stage.

If the value of amplitude of the first signal detected (always downstream of the conditioning stage) in the absence of an arc exceeds the first reference value of the first comparator, the value detected in the absence of an arc is compared with the value detected in the presence of a simulated arc.

If the amplitude value downstream of the conditioning stage for the first signal detected in the absence of an arc is significantly lower than that detected in the presence of a simulated arc, then for example the first reference value of the first comparator is adjusted, increasing it to a value appropriately higher than the value of the first signal detected in the absence of an arc and lower than that of the first signal detected in the presence of a simulated arc.

In contrast, if the first amplitude value downstream of the conditioning stage for the first signal detected in the absence of an arc is higher than or slightly lower than that detected in the presence of a simulated arc, then the setting of the filter of the conditioning stage is adjusted, shifting its pass band until the amplitude value downstream of the conditioning stage detected in the absence of a simulated arc is reduced, in relation to that detected in the presence of a simulated arc.

This ensures that the device is not activated in an unwanted way.

Adjusting the protection device comprises setting the bandpass filter configured to condition the signal generated by the sensor, upstream of the comparator. Preferably, the bandpass filter is configured to eliminate the signals having frequency lower than 21 kHz and higher than 2.5 MHz.

Moreover, preferably, adjusting the protection device, again as regards setting or adjusting the conditioning stage, comprises selecting and setting one filter of two or more, but preferably three or more bandpass filters, operatively connected in parallel and defining respective bands which occupy different, consecutive portions of a predetermined frequency interval.

Preferably, the conditioning stage comprises a plurality of bandpass filters having respective pass bands placed in the frequency interval between 21 (or 20) kHz and 2.5 MHz.

Preferably, each filter of the plurality of bandpass filters defines a pass band having a width of between 10 and 20% of the band centre value set.

In particular, preferably, the conditioning stage comprises a plurality of bandpass filters having respective pass bands placed in the interval between 20 kHz and 2 MHz, in which each filter defines a pass band approximately between 10% and 20% of the respective band centre value selected.

In contrast, the second signal represents an amplitude of the component of the current with a frequency between 0 Hz and 20 kHz.

As regards the invention according to this description, the following should also be noticed.

The device disclosed detects the presence of electric arcs, mainly direct current series (potential sources sparking fires) which may begin in the wiring of the photovoltaic panels or in the main components of a photovoltaic system (cables, conductors, connectors, connections, terminals, terminal boards, switches, fuse holders, modules, boards and field panels, collections of cables in general, etc.).

The sensor is a transformer made of ferrite which detects the alternating current harmonic component resulting from the electric arc, in a similar way to that of an amperometric transformer, therefore without bringing the detecting device to string potential.

The conditioning stage is configured to amplify the signal of the sensor, and to band filter it, for checking only a well-defined zone of the spectrum and therefore remaining immune from disturbances arriving from the inverters themselves and from other disturbances which could be picked up from the wiring, panels or system as a whole. The conditioning stage also comprises, preferably upstream of the filter and of the amplifier, a system of protections, for safeguarding the device itself in the event of electric arcs or of excessively high amplitude signals.

The first comparator detects a peak (amplitude) value of the signal generated and conditioned and compares it with an (adjustable) minimum threshold value.

The second comparator detects a peak (amplitude) value of the signal generated by the second sensor and compares it with an (adjustable) minimum threshold value.

Any fault signal generated by the processor causes the switching and energizing of a relay, whose switching contacts, preferably "of the clean type" (that is to say, voltage free, or with null potential difference), are available in a board for releasing safety devices and/or generating alarms and indications (for example by means of a telephone call, an SMS, an e-mail or other indicating systems).

Preferably, the protection device comprises an output stage, comprising a memory for saving the arc detection which occurred. Moreover, in response to detection of the arc, the processor commands the switch on of an LED, to show the intervention to those people who go to inspect the system.

The protection device comprises, in addition to the sensor made of ferrite, a board on which the electronic components are mounted; that board preferably has an external 220V AC power supply.

This description also relates to a method for calibrating a device for protecting a direct current (photovoltaic) electrical system from electric arcs, the system having one or more modules (photovoltaic panels) and an inverter. The calibrating method comprises a step of analysing a spectrum of frequencies of a noise generated by the inverter, by means of a spectrum analyser. For example, the spectrum analyser may comprise an oscilloscope, or could be integrated in the device. The spectrum analyser may be part of the device or be a further instrument used for the calibration. The step of analysis makes clear in which frequency intervals the inverter noise is placed. Preferably, the step of analysis is performed during nominal operation of the inverter; moreover, the step of analysis may be performed during (or at a time immediately after) a switch off and/or a new switch on of the inverter (indeed, the noise may vary and be more intense in the inverter switch off and new switch on transients).

The calibrating method also comprises a step of setting (that is to say, presetting), as a function of the analysis of the spectrum of frequencies of the noise and by means of a selector (preferably the selector is the selector according to one or more of the characteristics described in this description, integrated in the device), of a bandpass filter of a conditioning stage of the device; the bandpass filter selected is preset in a zone of the spectrum in which the noise generated by the inverter appears reduced.

The calibrating method also comprises a step of setting a voltage reference value in a threshold comparator of the device, in which the voltage reference value which is set is higher than the voltage of the signal representing the inverter noise in the selected frequency band (in particular, is determined by the maximum value of the amplitude of the signal representing the noise in that frequency band, increased according to a safety coefficient which may be, for example, from 10% to 30%, or several tens of V).

The calibrating method may comprise a step of simulating an electric arc and of verifying that the processor of the device generates, in response to the simulation of the electric arc, a fault signal.

Therefore, in order to calibrate the device, the following steps are performed:
  connecting the device to the system (according to one or more of the aspects described in this description), in a condition in which the system is operating (therefore the inverter is supplying current), but with no simulation of an electric arc (which refers to a simulation of a fault by means of a suitable calibrator or electric arc generator);
  analysing (within the domain of the frequencies) the signal generated by the first sensor (the signal as input for the conditioning stage); that analysis may be performed by means of a spectrum analyser separate from the device, or by means of the device itself, preferably equipped with a screen configured to display the spectrum of the signal generated;
  repeating this analysis after having switched the inverter off and back on again, to simulate different operating conditions;
  applying a setting (preliminary, that is to say, for initialization) of the bandpass filter of the conditioning stage (according to one or more of the characteristics included in this description, with regard to the bandpass filter and the relative selector), so as to place the pass band in a zone of the spectrum which is affected to a reduced or null extent by the inverter noise (taking into account the different operating conditions);
  reading the amplitude value (voltage value) of the signal generated by the device downstream of the conditioning stage (that is to say, the signal as input for the comparator), adopting that value as indicative of the level of noise in the selected (preset) band; that reading may be performed by means of a tester, if the device is provided with a terminal accessible from the outside to make that voltage value (signal amplitude) available, or it could be directed onto a screen of the device, if the device is equipped with a screen or any graphical interface for displaying the value;
  setting the threshold of the comparator to a value higher than the amplitude value of the signal generated, according to a safety coefficient (if necessary, when selecting the safety coefficient, atmospheric conditions and time of year will be taken into account (and other relevant factors for estimating the quantity of radiation in the whole period of the year) at the moment of calibration;
  connecting the electric arc generator, for simulating a fault, and checking if the device effectively detects the arc; preferably, reading the amplitude value detected by the instrument;
  based on the result of the preceding step (of fault simulation), if necessary refining the setting of the bandpass filter of the conditioning stage and/or of the comparator threshold, according to a repetitive process (that is to say, the steps described above are repeated, from the step of setting the filter or from the step of setting the threshold).

BRIEF DESCRIPTION OF DRAWINGS

This and other characteristics will be more apparent from the following description of a preferred embodiment, illustrated by way of example only and non-limiting in the appended drawings, in which:
FIG. 3 illustrates a first and a second sensor of the invention of FIG. 1;
FIG. 4 illustrates a photovoltaic system comprising a plurality of protection devices according to this invention;
FIGS. 5, 6, 7 illustrate the photovoltaic system of FIG. 1 according to respective alternative embodiments.

DETAILED DESCRIPTION OF PREFERRED EMBODIMENTS OF THE INVENTION

Figure 1:
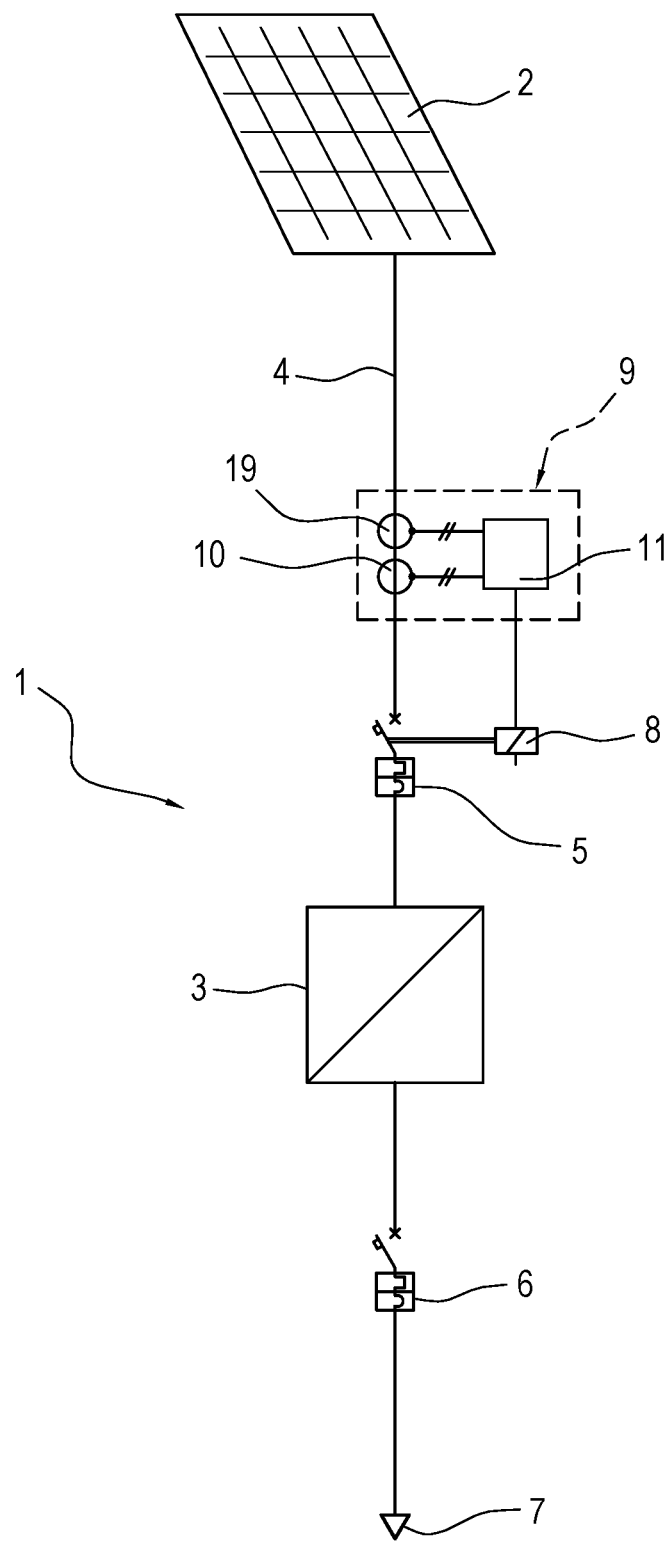
FIG. 1 is a schematic illustration of a photovoltaic system with a protection device according to this invention.
Figure 2:
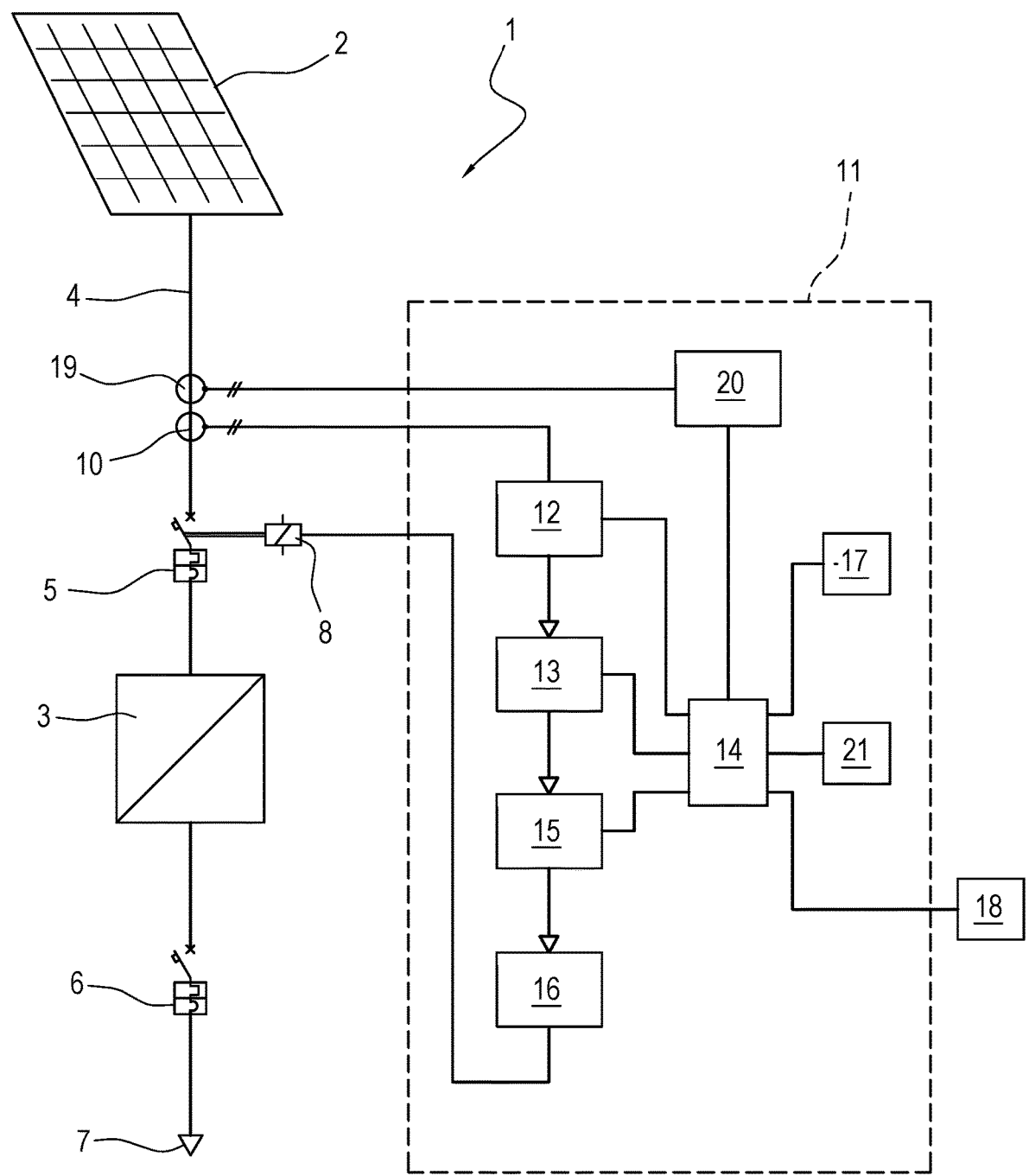
FIG. 2 illustrates the system of FIG. 1, in which the functional elements of the circuit board of the protection device have been illustrated.
Figure 7:
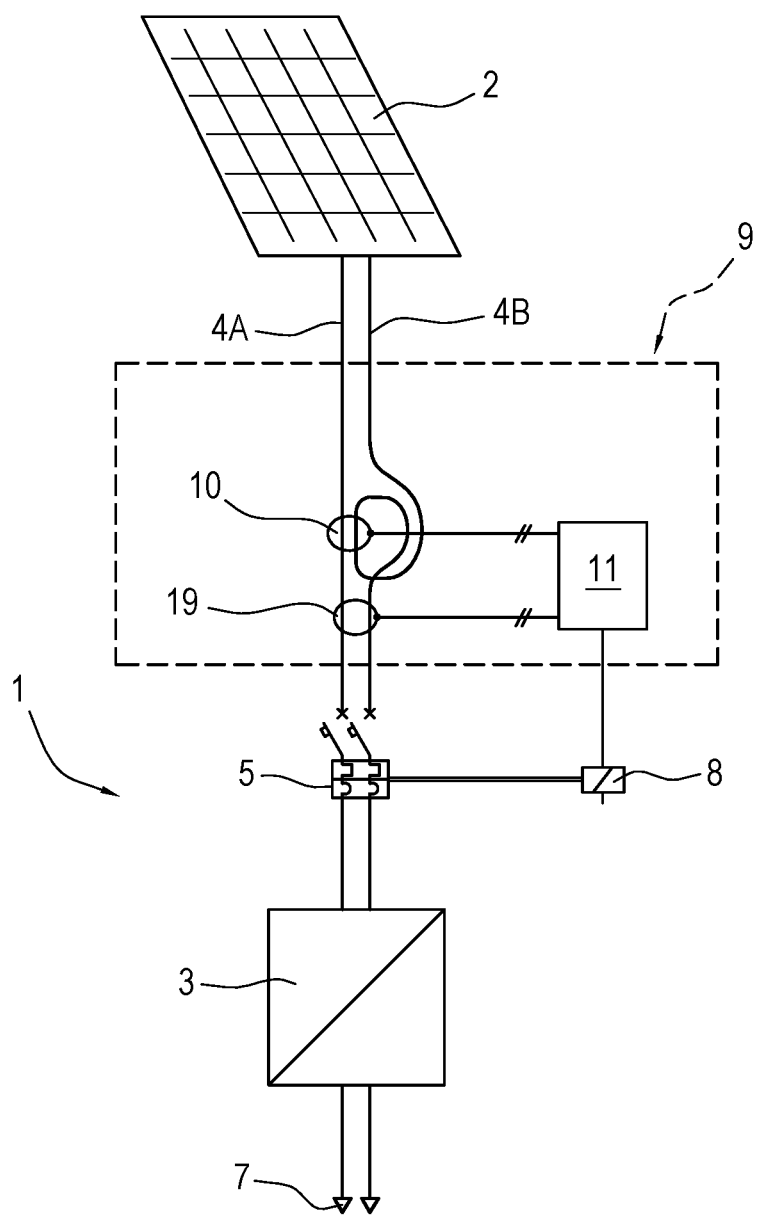

In the figures, 1 indicates a photovoltaic system.

The photovoltaic system 1 comprising one or more photovoltaic modules 2. Each photovoltaic module 2 has a plurality of photovoltaic panels (not illustrated), preferably connected in series, for forming a group (or module) of photovoltaic panels.

The photovoltaic modules 2 are connected to an inverter 3.

A protection switch 5 is inserted in a connecting branch 4 which connects the photovoltaic modules 2 (or a single photovoltaic module 2) to the inverter 3; the photovoltaic system 1 comprises a plurality of protection switches 5, inserted between the inverter 3 and respective photovoltaic modules 2.

A further electric protection 6 is inserted downstream of the inverter 3, between the inverter 3 and an AC electric mains network 7.

8 indicates an opening coil of the protection switch 5. That coil 8 is a relay for activating the protection switch 5.

The photovoltaic system 1 also comprises at least one protection device 9, configured to detect the presence of an electric arc in the photovoltaic system 1.

The protection device 9 is inserted in the connecting branch 4 which connects the photovoltaic modules 2 to the inverter 3. The branch 4 is defined by a cable comprising un first conductor 4A and a second conductor 4B. Of the first conductor 4A and the second conductor 4B, one is positive and the other is negative. Hereinafter, for the sake of simplicity, the first conductor 4A will be referred to as the positive conductor 4A and the second conductor 4B as the negative conductor 4B. Nevertheless, the first conductor 4A could be negative and the second conductor 4B could be negative.

The protection device 9 is configured to generate a fault signal, in response to the detection of an electric arc. The protection device 9 is connected to the opening coil 8 of the protection switch 5, in order to open the switch by means of the fault signal.

The protection device 9 comprises a first sensor 10 couplable to an electric cable for detecting the current flowing through it. Operatively, the first sensor 10 is coupled to the connecting branch 4 which connects the modules 2 to the inverter 3. The first sensor 10 preferably comprises a first ring 101 of ferromagnetic material (for example ferrite). That simplifies installation of the device 9 on pre-existing systems 1, avoiding cutting the cables.

Preferably, the first ring 101 has a first and a second half-ring which are movable relative to each other between an open position and a closed position. That further simplifies installation of the device 9 on pre-existing systems 1, also avoiding having to detach one end of a cable from a terminal or having to open a connector.

The protection device 9 comprises a second sensor 19 couplable to the electric cable for detecting a second signal, representing the direct current (or low frequency alternating) component of the current flowing through it.

Operatively, the second sensor 19 is coupled to the connecting branch 4 which connects the modules 2 to the inverter 3.

The second sensor 19 preferably comprises a second ring 191 of ferromagnetic material (for example ferrite).

It should be noticed that, in one embodiment the second sensor 19 is interposed between the first sensor 10 and the inverter 3. It another embodiment the first sensor 10 is interposed between the second sensor 19 and the inverter 3.

Preferably, the second ring 191 (similarly to the first ring) has a first and a second half-ring which are movable relative to each other between an open position and a closed position.

The second sensor 19 also comprises a Hall effect probe 192. Preferably, the Hall effect probe 192 is coupled to the second ring 191.

In one embodiment, only the first conductor 4A is inserted into the first ring 101 and into the second ring 191 (whilst the second conductor 4B is not). In one embodiment, only the second conductor 4B is inserted into the first ring 101 and into the second ring 191 (whilst the first conductor 4A is not).

In one embodiment, both of the conductors, positive 4A and negative 4B of the cable which defines the connecting branch are inserted into the first ring 101 and into the second ring 191, parallel to each other in the same direction.

In another embodiment, the conductors, positive 4A and negative 4B are inserted into the first ring 101 and into the second ring 191 in opposite directions. In other words, having defined a direction of the cable from the module 2 to the inverter 3, the first conductor 4A passes first in the first ring 101 and then in the second ring 191 (in the direction of the cable), whilst the second conductor 4B passes first in the second ring 191 and then in the first ring 101 (in the direction of the cable). Therefore, the first conductor 4A and the second conductor 4B pass each other in opposite directions.

In a further embodiment, the conductors, positive 4A and negative 4B are inserted into the first ring 101 in opposite directions, and into the second ring 191 in the same direction. Therefore, the first conductor 4A and the second conductor 4B pass each other in opposite directions only at the first ring 101.

Thanks to these system solutions with insertion of the first conductor 4A and the second conductor 4B passing each other in opposite directions, there is greater efficiency in identifying disturbances in several operating conditions.

In one embodiment, the device 9 comprises a third sensor 26, configured to detect a residual current (and therefore to detect a ground fault). The third sensor 26 comprises a third ring of ferromagnetic material. In one embodiment, the third sensor 26 is interposed between the second sensor 19 and the inverter 3.

The third sensor 26 is connected to the processor 14 (that is to say, to the circuit board 11) for sending it a signal representing the residual current. In one embodiment, the device 9 comprises a third threshold comparator, interposed between the third sensor 26 and the processor 14. The processor 14 (that is to say, the circuit board 11) is configured to open the protection switch 5 as a function of the signal generated by the third sensor (that is to say, as a function of the threshold value of the third threshold comparator being exceeded). In one embodiment, the processor 14 (that is to say, the circuit board 11) is configured to generate an alarm signal as a function of the signal generated by the third sensor.

The protection device 9 also comprises a circuit board 11.

Preferably, the first sensor 10 and the second sensor 19 are separate from the circuit board 11 for easy installation and to reduce interference and overheating.

The protection device 9 (in particular the circuit board 11 of the protection device 9) comprises a conditioning stage 12 for a signal generated by the first sensor 10. The conditioning stage 12 has a bandpass filter, for conditioning the signal generated by the sensor 10.

The protection device 9 (in particular the circuit board 11 of the protection device 9) comprises a first comparator 13 (preferably a threshold comparator); the first comparator 13 has a first, preset, adjustable voltage reference value and is configured to receive as input the first conditioned signal.

The protection device 9 (in particular the circuit board 11 of the protection device 9) comprises a second comparator 20 (preferably a threshold comparator); the second comparator 20 has a second, preset, adjustable voltage reference value and is configured to receive as input the second signal generated by the second sensor 19.

Moreover, the protection device 9 (in particular the circuit board 11 of the protection device 9) comprises a processor 14 for generating a fault signal as output from the protection device 9.

It should be noticed that the first comparator 13 and/or the second comparator 20 could also be defined by the processor 14.

The protection device 9 (in particular the circuit board 11 of the protection device 9) also comprises a counter 15 or timer.

The processor 14 is programmed to activate the counter in response to the first signal generated and conditioned exceeding the first reference value (of the first comparator 13), combined with the second signal generated exceeding the second reference value (of the second comparator 20).

In one embodiment, the processor 14 is programmed to generate the fault signal as a function of a further case of the first signal exceeding the first reference value, combined with a further case of the second signal exceeding the second reference value, a predetermined time interval after the first combined values being exceeded.

It should be noticed that, preferably, the predetermined time interval is adjustable, that is to say, can be set to another value. That increases the possibilities for adapting the protection device 9 to the conditions of the system 1 into which it is inserted, during the step of installing, making the device itself particularly reliable and robust.

Therefore, preferably, the processor 14 is configured to allow an adjustment of the predetermined time interval.

Moreover, preferably, the protection device 9 (in particular the circuit board 11 of the protection device 9) comprises a memory 16.

Preferably, the protection device 9 (in particular the circuit board 11 of the protection device 9) comprises an indicator 17, having at least one on configuration and one off configuration. Preferably, the indicator 17 is a light indicator (for example an LED or another warning light), but may also be acoustic or of another type.

Preferably, the processor 14 is programmed to record in the memory 16 data representing a fault signal generating event; that is to say, the processor 14 is programmed to record in the memory the events of detection of electric arcs in the photovoltaic system 1 into which the protection device 9 is inserted.

Preferably, the processor is programmed to set the indicator 17 in the on configuration, if the fault signal is generated, that is to say, following detection of an electric arc in the photovoltaic system 1 into which the protection device 9 is inserted.

The protection device 9 also comprises a power source 18, preferably 200V AC.

The conditioning stage 12 is preferably configured to cut the frequencies lower than a minimum value (for example 20 kHz) and higher than a maximum value (for example 2.5 MHz).

Moreover, the system 1 comprises a plurality of modules 2 (that is to say, groups or arrays of modules 2), each of which is connected to the inverter 3 by means of a respective connecting branch 4. For example, the system 1 may comprise six groups of modules 2 (in which the modules of each group are connected to each other in series).

The system comprises a plurality of protection devices 9, each inserted into a respective branch 4 to detect the presence of an electric arc in the respective module 2 (or group of modules 2) and to generate a fault signal which opens a respective protection switch 5.

The system 1, according to one aspect of this invention, comprises a processing unit 22 connected to the protection devices 9 of the modules 2 (or groups of modules 2), in particular to the circuit boards 11 of the protection devices 9.

In one embodiment, the system 1 also comprises an output unit 23 of the processing unit 22. The output unit 23 may include, for example, a screen and/or a warning light.

Moreover, the processing unit 22 (and/or the circuit board 11) may include an ethernet communication cable and/or a system for connection to the wi-fi network.

The processing unit 22 (and/or the circuit board 11) also has an IP address.

In one embodiment, the system 1 also comprises an input unit 24 of the processing unit 22. The input unit 24 may be local or remote. The input unit 24 may include, for example, one or more pushbuttons or a keyboard. Preferably, the input unit 24 is configured to allow the operator, during system 1 set-up, to control the selector of each device 9 in order to select a filter defining a respective pass band for each device 9, and/or to start, for each device 9, an adjustment command in order to automatically perform a scan of the frequency interval, in order to select the appropriate bandpass filter (as illustrated in this description) excluding false positives.

Moreover, the input unit 24 may be configured to perform polling in order to verify a condition of the system or part of it.

In one embodiment, the system 1 also comprises a power source 25 of the processing unit 22.

According to one aspect of this invention, in addition two or more cables, defining respecting connecting branches 4 which connect respective modules 2 (or groups of modules 2) to the inverter, are connected to a single, multi-channel protection device 9.

In one embodiment, that multi-channel protection device 9 comprises a plurality of first sensors 10 and a plurality of second sensors 19, configured to detect the currents flowing through respective branches 4 and connected to a single circuit board 11 (in particular, to a single processor 14). In this embodiment, the circuit board 11 therefore has a plurality of inputs. The circuit board 11 may comprise, for each first sensor 10, a respective conditioning stage 12 and a respective first comparator 13 and, for each second sensor 19, a respective second comparator 20 (in this way, it is possible to set different pass band and threshold values for the various modules 2 or groups of modules); or, the first sensors 10 of the plurality may be connected to a single conditioning stage 12 and to a single first comparator 13 and the second sensors 19 of the plurality may be connected to a single second comparator 20 (in this way, there is an obvious saving in terms of costs). Preferably, the circuit board 11 (that is to say, the processor 14) is configured to divide a period of time into portions dedicated to the respective modules 2 or groups of modules 2.

In one embodiment, two or more cables 4 are inserted into a first ring 101 (defining a single first sensor 10) and into a second ring 191 (defining a single second sensor 19). In this way, if a fault signal is detected, all of the modules 2 concerning the two or more cables 4 are disconnected (by opening of a switch 5); on the other hand, there is a saving in terms of costs. It should be noticed that there is also a solution in which two or more cables 4 of respective modules (or strings) are inserted into the same first ring 101 and second ring 191 and the positive and negative conductors of each cable 4 pass each other in opposite directions as described above. This invention also makes available a method for protecting a (direct current) electrical system 1.

In one embodiment, the system 1 is a photovoltaic system. The photovoltaic system 1 has at least one photovoltaic module 2 provided with a plurality of photovoltaic panels (preferably connected in series), an inverter 3 connected downstream of the photovoltaic modules 2, a protection switch 5 inserted between the inverter and the photovoltaic module.

The photovoltaic system 1 is also equipped with at least one protection device 9, preferably inserted in a connecting branch 4 which connects the photovoltaic module 2 to the inverter, in order to detect the presence of an electric arc in the system 1 and generate a fault signal; the fault signal is an activation signal of a coil 8 (that is to say, a relay) for opening the protection switch 5.

Installation of the protection device 9 comprises steps of coupling the sensor 10 of the protection device 9 to the system 1, and adjusting (that is to say, setting) the protection device 9, to adapt the protection device 9 to the system 1 to which it is coupled.

Coupling the protection device 9 to the system 1 involves inserting a cable, defining the connecting branch 4 which connects the photovoltaic module 2 to the inverter 3, into a first through hole of the protection device 9: that first through hole is defined by a first ring 101 of ferromagnetic material forming the sensor 10.

Coupling the protection device 9 to the system 1 involves inserting the cable into a second through hole of the protection device 9: that second through hole is defined by a second ring 191 of ferromagnetic material to which a Hall effect probe 192 is coupled. The second ring 191 and the probe 192 form the sensor 19.

In one embodiment, the cable comprises un first conductor 4A and a second conductor 4B. In one embodiment, the first conductor 4A is a positive wire and the second conductor 4B is a negative wire (in another embodiment, vice versa).

A first direction of insertion and a second direction of insertion (opposite to the first direction) are defined. The first direction of insertion is defined from the one or more modules 2 to the inverter 3, the second direction of insertion is defined from the inverter 3 to the one or more modules 2.

In one embodiment, the first conductor 4A is inserted into the first ring 101 in the first direction of insertion and the second conductor 4B is inserted into the first ring 101 in the second direction of insertion. Therefore, the first conductor 4A and the second conductor 4B pass each other in opposite directions at the first ring 101.

In one embodiment, the first conductor 4A is inserted into the first ring 101 and into the second ring 191 in the first direction of insertion and the second conductor 4B is inserted into the first ring 101 and into the second ring 191 in the second direction of insertion. Therefore, the first conductor 4A and the second conductor 4B pass each other in opposite directions at the first ring 101 and the second ring 191.

These embodiments make the system particularly effective at distinguishing between disturbances and an electric arc.

Moreover, the method in one embodiment comprises inserting the cable 4 (that is to say, the first conductor 4A and the second conductor 4B) into a third ring of ferromagnetic material defining a third sensor 26. The third sensor 26 detects a residual current, and therefore a ground fault. The third sensor 26 is connected to the processor 14 which, as a function of the signal generated by the third sensor 26, opens the protection switch 5.

Adjusting the protection device 9 comprises a step of setting a first voltage reference value of a first comparator 13. Adjusting the protection device 9 comprises a step of setting a second voltage reference value of a second comparator 20. Moreover, it comprises a step of setting a predetermined time interval (for the timer 15, that is to say, for the processor 14).

The processor 14 is programmed to generate the fault signal as a function of a first signal generated by the first sensor 10 (and conditioned by the conditioning stage 12) exceeding the first reference value, combined with the second signal generated by the second sensor 19 exceeding the second reference value, in at least two successive moments after the predetermined time interval.

In particular, the condition of the second signal exceeding the second reference value is a condition necessary for the second signal exceeding the first reference value in at least two successive moments within the predetermined time interval to be indicative of the presence of an electric arc.

Those adjusting steps occur after test steps performed on the photovoltaic system 1, in two operating conditions: in the presence of a simulated electric arc and one in the absence of an electric arc in the system, but with the system operating (with its normal effectiveness).

Preferably, adjusting the protection device comprises setting or adjusting the bandpass filter of the conditioning stage 12.

Preferably, adjusting the protection device 9, in particular with reference to the conditioning stage 12, comprises selecting one filter of three or more bandpass filters, defining respective bands occupying different, consecutive portions of a predetermined frequency interval.

That adjusting is performed as a function of the amplitude values of the signal generated and conditioned (that is to say, downstream of the conditioning module), in the above-mentioned two operating configurations of the photovoltaic system 1.

The following paragraphs, listed with alphanumeric references, are example, non-limiting ways of describing this invention.

A. Device 9 for protecting a direct current electrical system 1 having one or more modules 2 from electric arcs, the device comprising:
- a (first) sensor 10 provided with a (first) ring of ferromagnetic material configured to generate a (first) signal, representing a current flowing through a cable inserted into the ring;
- a conditioning stage, having a bandpass filter, for conditioning the (first) signal generated by the (first) sensor;
- a (first) threshold comparator, having a (first), preset, adjustable voltage reference value, the (first) comparator being configured to receive as input the (first) signal conditioned by the conditioning stage;
- a processor, programmed to generate a fault signal in response to an occurrence of the first signal exceeding the (first) reference value of the (first) comparator 13.

A1. The device 9 according to paragraph A, comprising a counter 15, wherein the processor 14 is programmed:
- to activate the counter 15 upon occurrence of the first signal exceeding the (first) reference value of the (first) comparator 13;
- to generate a fault signal as a function of the amplitude of the (first) signal generated and conditioned staying above the (first) reference value for at least a predetermined time interval.

A2. The device 9 according to paragraph A or paragraph A1.1, further comprising:
- a second sensor 19, configured to generate a second signal representing a direct current component of the current flowing through the cable;
- a second threshold comparator 20, having a second, preset, adjustable voltage reference value, the second comparator 20 being configured to receive as input the second signal generated by the second sensor 19, wherein the processor 14 is programmed to generate a fault signal in response to the occurrence of both of the following conditions, combined:
- the first signal exceeds the first reference value of the first comparator 13,
- the second signal exceeds the second reference value of the second comparator 20.

A2.1. The device 9 according to paragraph A2, including a counter 15, wherein the processor 14 is programmed:
- to activate the counter 15 upon occurrence of both the conditions of the first signal exceeding the first reference value of the first comparator 13 and the second signal exceeding the second reference value of the second comparator 20;

to generate a fault signal as a function of the amplitude of the first signal generated and conditioned staying above the first reference value and the amplitude of the second signal staying above the second reference value, for at least a predetermined time interval.

A2.2. The device 9 according to paragraph A2 or paragraph A2.1, wherein the bandpass filter of the conditioning stage 12 has a pass band placed in an interval of frequencies which are higher than the frequency of the component detected by the second sensor 19.

A3. The device 9 according to any one of paragraphs A and A2.2, wherein the conditioning stage 12 has two or more bandpass filters, operatively connected in parallel and defining bands which occupy different, consecutive portions of a predetermined frequency interval, and wherein the device further comprises a selector connected to the conditioning stage 12 and configured to set a bandpass filter alternative to the other bandpass filter or filters.

A3.1. The device 9 according to paragraph A3, wherein the processor 14 is configured to save in a database, for the fault signal generated by the processor, a record including the voltage value of the output signal from the conditioning stage upon occurrence of the fault signal and/or a piece of information relative to the bandpass filter selected when the fault signal occurred.

A3.1.1. The device 9 according to A3.1, further comprising a user interface 21, connected to the processor 14 and programmed to receive from a user, upon occurrence of the fault signal generated by the processor, a false positive indication (or command), wherein the record further includes the false positive indication.

A3.1.2. The device 9 according to paragraph A3.1 or paragraph A3.1.1, wherein the record also includes a time indication relative to the moment in which the fault signal occurred.

A3.1.3. The device 9 according to any one of paragraphs A3.1 to A3.1.2, wherein the record also includes a radiation to earth value at the moment in which the fault signal occurred.

A3.1.4. The device 9 according to any one of paragraphs A3.1 to A3.1.3, wherein the record also includes a value of power supplied by the electrical system 1 at the moment in which the fault signal occurred.

A4. The device 9 according to any one of paragraphs A to A3.1.4, comprising a screen connected to the processor 14 and configured to display in real time the voltage value of the first signal conditioned by the conditioning stage 12.

A5. The device 9 according to any one of paragraphs A to A4, comprising a screen connected to the processor 14 configured to display in real time the voltage of the first signal generated by the first sensor 10, upstream of the conditioning stage 12, in a spectrum of frequencies of the first signal.

A6. The device 9 according to any one of paragraphs A to A5, comprising a second sensor 19 and a screen connected to the processor 14, wherein the second sensor is configured to generate a second signal representing a direct current component of the current flowing through the cable, wherein the screen is also configured to display in real time the voltage value of the second signal generated by the second sensor 19.

B. A direct current electrical system 1, comprising: one or more modules 2; an inverter 3 connected downstream of the one or more modules 2; one or more protection switches 5 inserted between the inverter 3 and the modules 2; at least one protection device 9, inserted in a connecting branch 4 which connects the one or more modules 2 to the inverter 3, in order to detect the presence of an electric arc in the system 1 and generate a fault signal and transmit it to the protection switch 5 in order to open the switch, wherein the protection device 9 is a protection device according to any one of paragraphs A to A5.1.

C. An inverter 3 comprising a protection device 9 according to one of paragraphs A to A5.1.

D. A method for protecting an electrical system 1 having one or more modules 2, wherein the method comprises the following steps:

providing a protection switch 5 and a protection device 9; installing the protection switch and the protection device in a connecting branch which connects the one or more modules 2, wherein the protection device 9 is programmed to generate a fault signal and transmit it to the protection switch in order to open the switch, wherein the step of installing includes the following sub-steps:

inserting a cable, defining the connecting branch 4 which connects the one or more modules 2, into a first through hole of the protection device 9, the first through hole being defined by a first ring 101 of ferromagnetic material forming a first sensor 10 configured to generate a first signal, representing a current flowing through the cable;

adjusting the protection device 9 by setting a first reference value of a first threshold comparator 13 configured to receive the first signal downstream of a conditioning stage 12 connected downstream of the first sensor 10.

D1. The method according to paragraph D, wherein the step of installing includes a sub-step of connecting a second sensor 19 to the cable defining the connecting branch 4, wherein the second sensor is configured to generate a second signal representing a direct current component of the current flowing through the cable, wherein the sub-step of adjusting the protection device 9 includes setting a second reference value of a second threshold comparator 20 configured to receive the second signal, and wherein the fault signal is generated as a function of the occurrence of both of the following conditions, combined: —the first signal exceeds the first reference value of the first comparator 13, —the second signal exceeds the second reference value of the second comparator 20.

D2. The method according to paragraph D or paragraph D1, comprising a step of setting one bandpass filter of two or more bandpass filters of the conditioning stage 12, operatively connected in parallel and defining bands which occupy different, consecutive portions of a predetermined frequency interval, the setting being performed by means of a selector.

D2.1. The method according to paragraph D2, comprising a step of saving in a database, for the fault signal generated by the processor, a record including the voltage value of the output signal from the conditioning stage upon occurrence of the fault signal and/or a piece of information relative to the bandpass filter active when the fault signal occurred.

D2.1.1. The method according to paragraph D2.1, comprising a step of receiving, upon occurrence of the fault signal generated by the processor, a false positive indication (or command), wherein the record further includes the false positive indication.

D2.1.2. The method according to paragraph D2.1 or paragraph D2.1.1, wherein the record also includes a time indication relative to the moment in which the fault signal occurred.

D2.1.3. The method according to any one of paragraphs D2.1 to D2.1.2, wherein the record also includes a radiation to earth value at the moment in which the fault signal occurred.

D2.1.4. The method according to any one of paragraphs D2.1 to D2.1.3, wherein the record also includes a value of power supplied by the electrical system 1 at the moment in which the fault signal occurred.

D3. The method according to any one of paragraphs D to D2.1.4, comprising a step of displaying in real time on a screen the voltage value of the first signal conditioned by the conditioning stage 12.

D4. The method according to any one of paragraphs D to D3, comprising a step of displaying in real time on a screen the voltage of the first signal generated by the first sensor 10, upstream of the conditioning stage 12, in a spectrum of frequencies of the first signal.

D4.1. The method according to paragraph D4 comprising a step of displaying in real time on a screen a direct current component of the current flowing through the cable, wherein the screen is also configured to display in real time the voltage value of the second signal generated by the second sensor 19.

E. A database comprising a plurality of records, each record being associated with a fault signal generated by a device for protecting a direct current electrical system 1 from electric arcs, comprising a (first) sensor 10 provided with a (first) ring of ferromagnetic material configured to generate a (first) signal, representing a current flowing through a cable inserted into the ring; a conditioning stage, having a bandpass filter, for conditioning the (first) signal generated by the (first) sensor; a (first) threshold comparator, having a preset, adjustable (first) voltage reference value, the (first) comparator being configured to receive as input the (first) signal conditioned by the conditioning stage; a processor programmed to generate a fault signal in response to the (first) signal exceeding the (first) reference value of the (first) comparator 13, wherein each record includes one or more of the following data:
the voltage value of the output signal from the conditioning stage upon occurrence of the fault signal and a piece of information relative to the bandpass filter for which the fault signal occurred;
a piece of information relative to the bandpass filter active in the conditioning stage when the fault signal occurred;
a false positive indication (or command);
a time indication relative to the moment in which the fault signal occurred;
a radiation to earth value at the moment in which the fault signal occurred;
a value of power supplied by the electrical system 1 at the moment in which the fault signal occurred;
a temperature of the modules at the moment in which the fault signal occurred;
a piece of information relative to the time elapsed since installation and/or last maintenance. F. A method for calibrating a device 9 for protecting a direct current electrical system 1 having one or more modules 2 and an inverter from electric arcs, the method comprising the following steps:
with the inverter switched on, analysis of a spectrum of frequencies of a noise generated by the inverter, by means of a spectrum analyser comprising an oscilloscope, to detect a signal representing the inverter noise in its spectrum of frequencies;
setting, as a function of the analysis of the spectrum of frequencies of the noise, a bandpass filter of a conditioning stage of the device, of two or more bandpass filters operatively connected in parallel and defining bands which occupy different, consecutive portions of a predetermined frequency interval, wherein the bandpass filter selected defines, between the two or more bandpass filters, the frequency band in which the noise generated by the inverter is lowest;
setting a voltage reference value in a threshold comparator of the device, in which the voltage reference value is higher than the voltage of the signal representing the inverter noise in the selected frequency band.

F1. The method according to claim F, wherein the analysis of the spectrum of frequencies is also performed during a switch off and new switch on of the inverter.

The invention claimed is:

1. A direct current electrical system, comprising:
one or more modules;
an inverter connected downstream of the one or more modules;
one or more protection switches inserted between the inverter and the modules;
at least one protection device, inserted in a branch which connects the one or more modules to the inverter, in order to detect the presence of an electric arc in the system and generate a fault signal and transmit it to the protection switch in order to open the switch,
wherein the at least one protection device comprises:
a first sensor provided with a first ring of ferromagnetic material configured to generate a first signal, representing a current flowing through a cable inserted in the ring;
a conditioning stage, having a bandpass filter, for conditioning the first signal generated by the first sensor;
a first threshold comparator, having a first, preset, adjustable voltage reference value, the first comparator being configured to receive as input the first signal conditioned by the conditioning stage;
a processor,
a second sensor, configured to generate a second signal representing a direct current component of the current flowing through the cable;
a second threshold comparator, having a second, preset, adjustable voltage reference value, the second comparator being configured to receive as input the second signal generated by the second sensor, wherein the processor is programmed to generate a fault signal in response to the occurrence of both of the following conditions:
the first signal exceeds the first reference value of the first comparator,
the second signal exceeds the second reference value of the second comparator.

2. The electrical system according to claim 1, further comprising:
a plurality of modules;
for each module, a respective protection switch and a respective protection device configured to detect the presence of an electric arc in the module and to generate a fault signal and transmit it to the protection switch of the respective module in order to open the switch,
a processing unit, connected to the protection devices of the modules of the plurality of modules and configured to receive from each protection device the respective first signal and the respective second signal, to process the first signal and the second signal received from the protection devices and to derive a diagnostic indication regarding a condition of the system as a function of the first signal and the second signal received from the protection devices.

3. The direct current electrical system according to claim 1, including a counter, wherein the processor is programmed:
to activate the counter upon occurrence of both the conditions of the first signal exceeding the first reference value of the first comparator and the second signal exceeding the second reference value of the second comparator;
to generate the fault signal as a function of the amplitude of the first signal generated and conditioned staying above the first reference value and the amplitude of the second signal staying above the second reference value concurrently for at least a predetermined time interval.

4. The direct current electrical system according to claim 3, wherein the bandpass filter of the conditioning stage has a pass band in an interval of frequencies which are higher than the frequency of the component detected by the second sensor.

5. The direct current electrical system according to claim 1, wherein the second signal represents the component of the current flowing through the cable having a frequency between 0 Hz and 20 kHz.

6. The direct current electrical system according to claim 1, wherein the bandpass filter of the conditioning stage has a pass band of width between 10% and 20% of the respective band centre value, the latter being selectable in a frequency interval between 20 kHz and 2.5 MHz, and preferably in a frequency interval between 1 MHz and 2.5 MHz.

7. The direct current electrical system according to claim 1, wherein the second sensor includes a second ring of ferromagnetic material surrounding the cable and a Hall effect probe applied to the second ring.

8. The direct current electrical system according to claim 1, wherein the conditioning stage has two or more bandpass filters, operatively connected in parallel and defining bands which occupy different, consecutive portions of a predetermined frequency interval, and wherein the device further comprises a selector connected to the conditioning stage and configured to set a bandpass filter alternative to the other bandpass filter or filters.

9. The direct current electrical system according to claim 8, further comprising:
a user interface, connected to the processor and programmed to receive from a user an adjustment command and a false positive indication relative to the fault signal generated by the processor;
wherein the selector is configured to set the two or more bandpass filters of the conditioning stage in succession in response to the adjustment command, and wherein the processor is configured to save in a database, in response to the false positive indication relative to the fault signal generated by the processor, a false positive record including a piece of information relative to the bandpass filter for which the false positive occurred.

10. The direct current electrical system according to claim 1, wherein the false positive record also includes a voltage value of the output signal from the conditioning stage upon occurrence of the fault signal indicated by the user as a false positive.

11. The direct current electrical system according to claim 1, comprising a screen connected to the processor and configured to display in real time a voltage value of the first signal conditioned by the conditioning stage.

12. The direct current electrical system according to claim 11, wherein the screen is configured to display in real time the voltage value of the first signal generated by the first sensor, upstream of the conditioning stage, in a spectrum of frequencies of the first signal.

13. The direct current electrical system according to claim 1, comprising a self-diagnosis module connected to the processor, configured to generate a test signal as input for the first sensor and/or the second sensor, to verify a response signal and to generate an alert signal as a function of the response signal.

14. A method for protecting an electrical system having one or more modules, wherein the method comprises the following steps:
providing a protection switch and a protection device;
installing the protection switch and the protection device in a connecting branch which connects the one or more modules, wherein the protection device is programmed to generate a fault signal and transmit it to the protection switch in order to open the switch, wherein the step of installing includes the following sub-steps:
inserting a cable, defining the connecting branch which connects the one or more modules, into a first through hole of the protection device, the first through hole being defined by a first ring of ferromagnetic material forming a first sensor configured to generate a first signal, representing a current flowing through the cable;
adjusting the protection device by setting a first reference value of a first threshold comparator configured to receive the first signal downstream of a conditioning stage connected downstream of the first sensor,
wherein the step of installing includes a sub-step of connecting a second sensor to the cable defining the connecting branch, wherein the second sensor is configured to generate a second signal representing a direct current component of the current flowing through the cable, wherein the sub-step of adjusting the protection device includes setting a second reference value of a second threshold comparator configured to receive the second signal, and wherein the fault signal is generated as a function of the occurrence of both of the following conditions:
the first signal exceeds the first reference value of the first comparator,
the second signal exceeds the second reference value of the second comparator.

15. The method according to claim 14, wherein the cable comprises a first conductor and a second conductor, wherein the first conductor is inserted into the first ring in a first direction of insertion, and the second conductor is inserted into the first ring in a second direction of insertion, opposite to the first direction of insertion.

16. The method according to claim 14, further comprising the following steps, carried out by the processor:
activating a counter upon occurrence of both the conditions of the first signal exceeding the first reference value of the first comparator and the second signal exceeding the second reference value of the second comparator;
generating a fault signal responsive to the amplitude of the first signal generated and conditioned staying above the first reference value and the amplitude of the second signal staying above the second reference value concurrently, for at least a predetermined time interval determined by the counter.

17. The method according to claim 14, further comprising the following steps:
- displaying in real time the first signal conditioned by the conditioning stage;
- displaying in real time the first signal generated by the first sensor, upstream of the conditioning stage, in a spectrum of frequencies of the first signal.

* * * * *

UNITED STATES PATENT AND TRADEMARK OFFICE
CERTIFICATE OF CORRECTION

| | | |
|---|---|---|
| PATENT NO. | : 11,942,896 B2 | |
| APPLICATION NO. | : 17/283857 | |
| DATED | : March 26, 2024 | |
| INVENTOR(S) | : Euro Marangoni et al. | |

It is certified that error appears in the above-identified patent and that said Letters Patent is hereby corrected as shown below:

On the Title Page

Item (22), Delete "Oct. 10, 2019" and insert therefor --Oct. 11, 2019--.

Signed and Sealed this
Twenty-seventh Day of August, 2024

Katherine Kelly Vidal
*Director of the United States Patent and Trademark Office*